United States Patent [19]
Signer

[11] Patent Number: 5,852,275
[45] Date of Patent: Dec. 22, 1998

[54] HEATING SYSTEM, VACUUM PROCESS CHAMBER COMPRISING SUCH A HEATING SYSTEM AND OPERATION OF SUCH A VACUUM PROCESS CHAMBER

[75] Inventor: Hans Signer, Nesslau, Switzerland

[73] Assignee: Balzers Aktiengesellschaft, Liechtenstein, Liechtenstein

[21] Appl. No.: 576,236

[22] Filed: Dec. 21, 1995

[30] Foreign Application Priority Data

Dec. 23, 1994 [DE] Germany ............... 44 46 297.2

[51] Int. Cl.$^6$ ........................................ B23K 10/00
[52] U.S. Cl. .................. 219/121.43; 219/121.54; 219/121.57; 219/121.48
[58] Field of Search ............ 219/121.43, 121.54, 219/121.57, 121.48; 156/345; 313/30, 39, 231.01, 346 R; 315/111.51, 111.21

[56] References Cited

U.S. PATENT DOCUMENTS

| | | |
|---|---|---|
| 3,706,872 | 12/1972 | Trabilcy ................... 219/300 |
| 4,101,724 | 7/1978 | Heine et al. . |
| 4,325,361 | 4/1982 | Harrison . |
| 4,499,369 | 2/1985 | Gibb . |
| 4,870,245 | 9/1989 | Price et al. .................... 219/121.36 |
| 4,994,706 | 2/1991 | Leung et al. ................. 313/231.01 |
| 5,403,992 | 4/1995 | Cole ........................... 219/528 |
| 5,426,351 | 6/1995 | Imura ......................... 313/337 |

FOREIGN PATENT DOCUMENTS

| | | |
|---|---|---|
| 2 531 300 | 7/1983 | France . |
| 388267 | 3/1923 | Germany . |

*Primary Examiner*—Mark H. Paschall
*Attorney, Agent, or Firm*—Evenson, McKeown, Edwards & Lenahan, P.L.L.C.

[57] ABSTRACT

A resistance heating system prevents the generation of magnetic fields by constructing the heating section as a looped current circuit. The heating current circuit as a whole is connected to the potential in order to, at the same time, use the heating section in a process chamber as a process electrode. In an AC-connection of the heating current circuit, a capacitive shielding prevents a reaction of the electrode operating potential with respect to the primary side of a transforming heating current actuator.

25 Claims, 3 Drawing Sheets

HEATING SYSTEM, VACUUM PROCESS CHAMBER COMPRISING SUCH A HEATING SYSTEM AND OPERATION OF SUCH A VACUUM PROCESS CHAMBER

CROSS-REFERENCE TO RELATED APPLICATION

This application is related to Priority Document No. P 44 46 297.2, based upon an application filed in Germany on Dec. 23, 1994 in the name of Hans SIGNER for HEATING SYSTEM, VACUUM PROCESS CHAMBER COMPRISING SUCH A HEATING SYSTEM AND OPERATION OF SUCH A VACUUM PROCESS CHAMBER, the subject matter of which is incorporated herein by reference.

BACKGROUND AND SUMMARY OF THE INVENTION

The present invention relates to a heating system for a process chamber having a transformer heating current transmitter, by way of which, on the secondary side, a heating current is generated in a heating current circuit. The present invention also relates to a vacuum process chamber with such a heating system, and to an operating method for such a vacuum process chamber constructed as a plasma process chamber.

It is known to provide resistance heating systems in vacuum process chambers, for example for PVD-, CVD- or PECVD-processes, or also in process chambers which are not operated under vacuum conditions, as for example for a thermal CVD. Providing such resistance heating systems on plasma process chambers is particularly critical because magnetic fields caused by the heating currents may interfere in a pronounced manner with the intended plasma process.

Furthermore, it is known in plasma processing that the coupling of electric potentials into the process chamber is often desired. It is carried out, however, in a targeted manner for producing the plasma discharge or for influencing the plasma treatment process and thus must definitely not be dependent on an intended heating output.

It is therefore known, specifically in the case of such known processes, to connect a heating current in a galvanically separate manner by way of the secondary side of a transformer transmitter to a chamber-side heating electrode, on which heat is generated according to Joule's principle. This requires, however, an alternating-current operation of the heating system. As mentioned above, because of the resulting magnetic fields, this alternating current operation can, in turn, markedly interfere with the plasma treatment process.

It is often also desirable to heat an electrode, which causes the plasma discharge, directly on a plasma process chamber so that such a system acting as a heating and discharge electrode is to be acted upon by a heating current as well as by a discharge operating potential. In this case, both quantities should be independent of one another. That is, the heating current should not cause any interfering magnetic fields in the process space, and a heating current actuator should not be connected to the discharge operating potential. The potential-related uncoupling of a heating current actuator presents problems particularly in the case of high frequency plasma discharge operation. A system or a plasma treatment process in the case of which the heating of one of the discharge electrodes is extremely desirable is illustrated in EP-A-0 533 044 which corresponds to U.S. Pat. No. 5,298,290.

It is an object of the present invention to provide a heating system having a transformer transmitter which ensures that an actuator for the heating output can be connected to an arbitrarily selectable potential, particularly to ground. However, the heating system is configured such that it generates virtually no magnetic field in the process chamber, which is to be implemented in a manner which is as simple as possible constructively and is low in cost.

The foregoing has been achieved in accordance with the present invention by constructing the heating system such that the heating current circuit comprises a heating electrode on which the heat current path is looped between adjacent current connections. Because of the fact that the heating electrode comprises a looped heating current guidance, the magnetic fields of the heating currents passing through in opposite directions will compensate one another and cancel each other out in the vicinity of the heating electrode.

In a constructionally very simple manner, the heating current looping is implemented by at least one coaxial conductor arrangement, on which, opposite the current connections, coaxial conductor arrangements, which are connected with one another, are preferably short-circuited. In a particularly simple embodiment of the present invention, at least two coaxial metal, preferably stainless steel, tubes which are connected at their end and are, for example, welded together.

Such a heating system is preferably used where the generation of magnetic fields, which are dependent on the heating output, is to be avoided in the process chamber.

In a further contemplated embodiment of the present invention, the heating electrode is also the process electrode for an electrode-supported process in the process chamber, that is, for example, the electrode for a plasma discharge or a carrier electrode for workpieces which, for influencing the workpiece treatment process, should be able to be connected in a targeted manner to an electric DC–, DC+AC– or AC–potential. The entire heating current circuit is raised by a process electrode operating source to its electric potential. In this, the operating source, on one hand, and a capacitive shielding between the primary and the secondary side of the transformer transmitter, on the other hand, are connected to a reference potential, preferably a ground potential. By virtue of the shielding, the process operating potential is prevented from being coupled capacitively to the primary side of the transformer transmitter, which is particularly significant when the operating potential of the operating source has AC-fractions, and particularly is a potential which comprises a high-frequency spectral fraction or high-frequency spectral fractions.

Furthermore, in a very simple manner, the secondary winding of the transformer transmitter is implemented by a coaxial cable, on which at least one exterior coaxial conductor is switched as a capacitive shielding, i.e., is connected to the reference potential, by a corresponding point connection.

The foregoing arrangement makes it possible to use an AC– or AC+DC–, particularly a high-frequency source in the above-mentioned sense, as an operating source for the electrode which also acts as a process and heating electrode. Thus, it is ensured that the heating can be controlled by an actuator, on the primary side of the transformer transmitter and at an arbitrarily selectable potential, particularly to ground. The heating electrode which operates as the process electrode may be operated with AC, AC+DC, particularly with high frequency and, for example, for plasma discharges at high voltage.

Thus a heating system is provided which permits a heating of a process chamber without having to supply a heating medium. The expenditure for electric uncoupling filters is essentially eliminated, and no radiant heaters are required in the process chamber. If the heating electrode is operated as a process electrode with AC, AC+DC, particularly with high frequency of high frequency fractions, as particularly for generating a high-frequency plasma discharge in the process chamber, stray capacitances, particularly between the secondary winding of the transformer transmitter and the shielding provided there, are taken into account on the known adaptation network to be provided for this operation of process electrodes.

BRIEF DESCRIPTION OF THE DRAWINGS

These and other objects, features and advantages of the present invention will become more readily apparent from the following detailed description thereof when taken in conjunction with the accompanying drawings wherein.

DETAILED DESCRIPTION OF THE DRAWINGS

Figure 1:
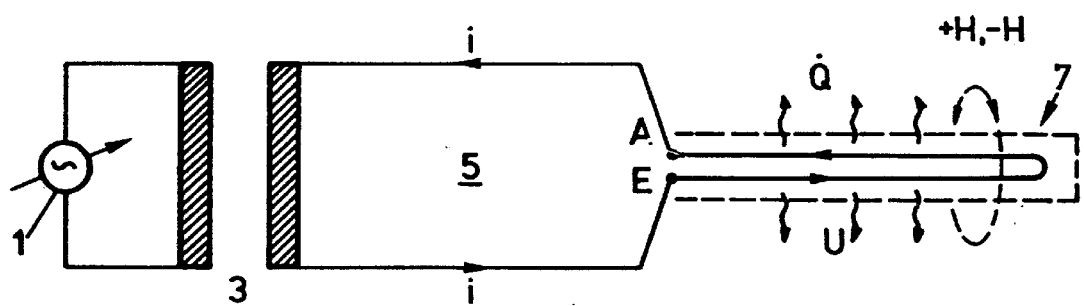
FIG. 1 is a schematic view of a heating system according to the present invention for preventing generation of magnetic fields in a heating electrode area.

According to FIG. 1, an AC-heating current generator 1 acts by way of a transformer-transmitter 3 upon a secondary-side heating current circuit 5 by way of a heating electrode 7 whose border is indicated by a dashed line. In the heating electrode 7, the heating current circuit 5 is looped between mutually adjacent connections A and E such that, in the vicinity U of the heating electrode 7, the magnetic fields are cancelled which are caused by the current i flowing back and forth. As a result, in this vicinity U, the magnetic fields ±H caused by a heating current i in any position are cancelled and, as illustrated by $\dot{Q}$, the vicinity U is heated.

Figure 2:
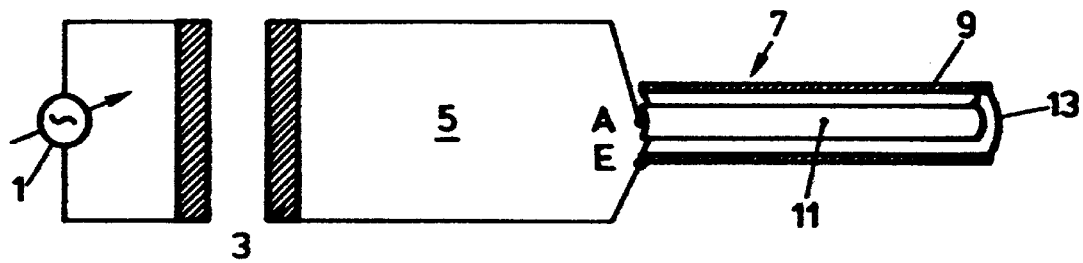
FIG. 2 is a schematic view of a particularly simple implementation of the heating system according to FIG. 1.

Although the heating electrode 7 according to FIG. 1 can be implemented in different ways, as, for example, by way of coplanar current conductors, a mechanically particularly simple implementation is shown in FIG. 2 in which the external conductor is formed by an electrically conducting tube 9 and the internal conductor is formed by an electrically conducting core or, preferably by an electrically conducting internal tube 11. The materials of the internal conductor tube 11 and of the external conductor tube 9 are preferably metal with a high specific resistance, which preferably is stainless steel, suitable for the resistance heating.

The secondary side of the transformer transmitter 3 is connected to the internal or external tube 11 or 9. The tubes 9, 11 are connected on their end side and opposite the current connections, as designated by reference numeral 13, and are preferably welded together. Thus a heating stick electrode without any magnetic fields is provided in an extremely simple manner.

Figure 3:
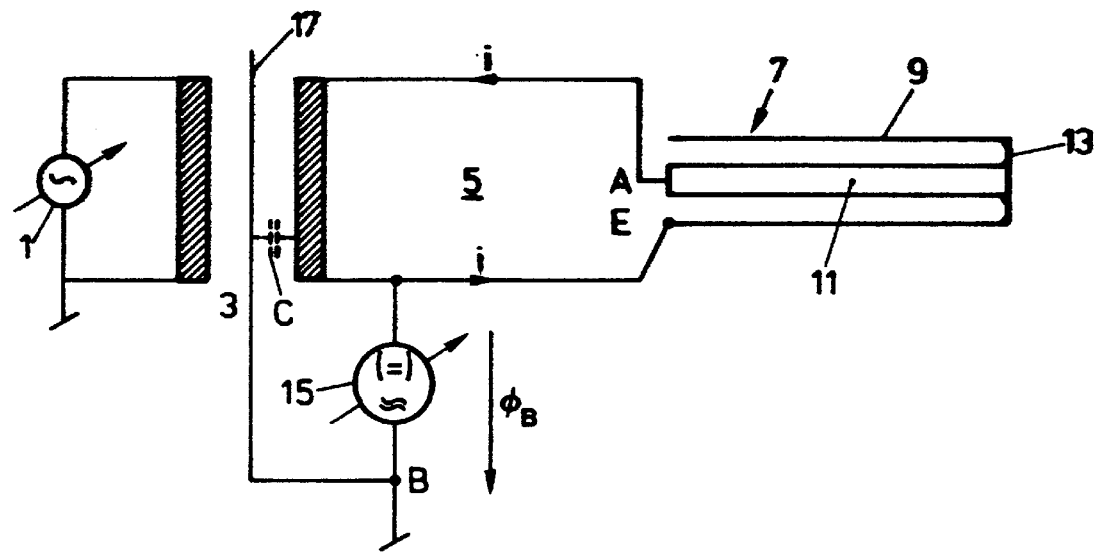
FIG. 3 is a schematic view, based on the heating system according to FIG. 2, of an electric operating source for operating the heating electrode as an electrically fed process electrode in a process chamber.

If the above-described heating electrode 7 of the heating arrangement according to the present invention is also to be operated as a process electrode in a process chamber, particularly in a vacuum process chamber and even more particularly in a plasma process chamber with AC-, AC+DC-, particularly with a high-frequency plasma discharge, FIG. 3 shows that the entire heating current circuit 5 with the heating electrode 7 is connected to the respective required process operating potential $\phi_B$, which may be a DC-, a DC+AC- or an AC-potential, but particularly a high-frequency potential or a potential with a high-frequency fraction, as during the connection of a square pulse potential.

The operating potential source 15, which can be adjusted for the process requirements, is, on one hand, connected with the heating current circuit 5 and, on the other hand, is connected with the reference potential, preferably ground potential. A capacitive shielding 17 is provided between the primary and the secondary side of the transformer transmitter 3. This shielding 17 prevents, particularly in the case of an operating potential with at least high-frequency fractions that, because of stray capacitances between the primary and the secondary side of the transformer transmitter 3, AC-, particularly high-frequency fractions or, generally, operating potential fractions can be coupled into the primary-side heating current actuator circuit.

As will be readily apparent now to a person skilled in the art to which the subject matter of this application is directed, a heating current actuator 1 can be connected to any potential, for example, as illustrated in FIG. 3, to the same reference potential, particularly to ground.

Figure 4:
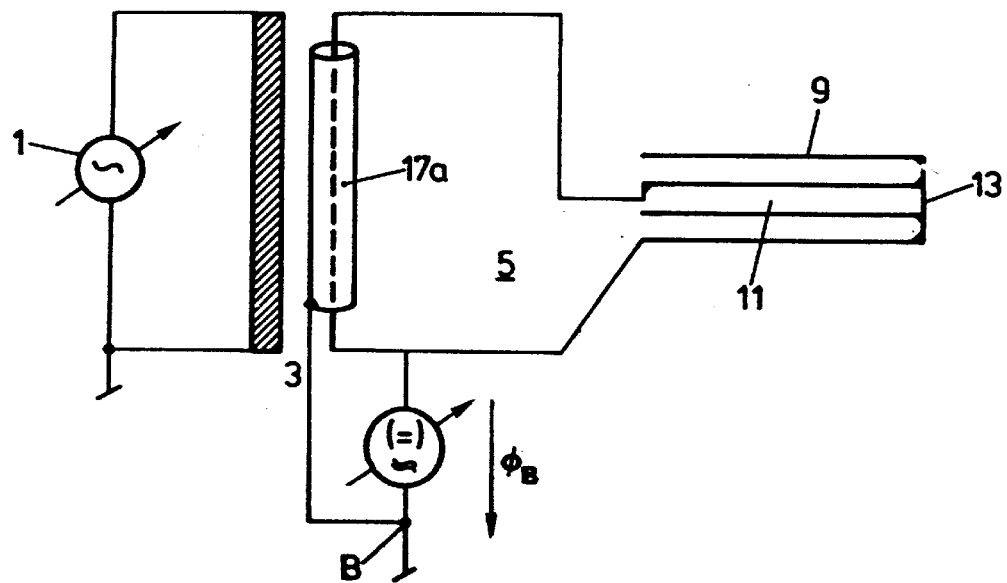
FIG. 4 is a schematic view, based on the heating system according to FIG. 3, of a particularly simple implementation, particularly of the secondary-side shielding.

FIG. 4 is a schematic view of a particularly simple, preferred implementation of the capacitive shielding 17 of FIG. 3. As illustrated in FIG. 4, the shielding 17 is formed by at least one external conductor 17a of the secondary-side winding of the transformer transmitter 3 formed by a coaxial cable, which transmitter 3 is connected with the reference potential at point B.

Figure 5:
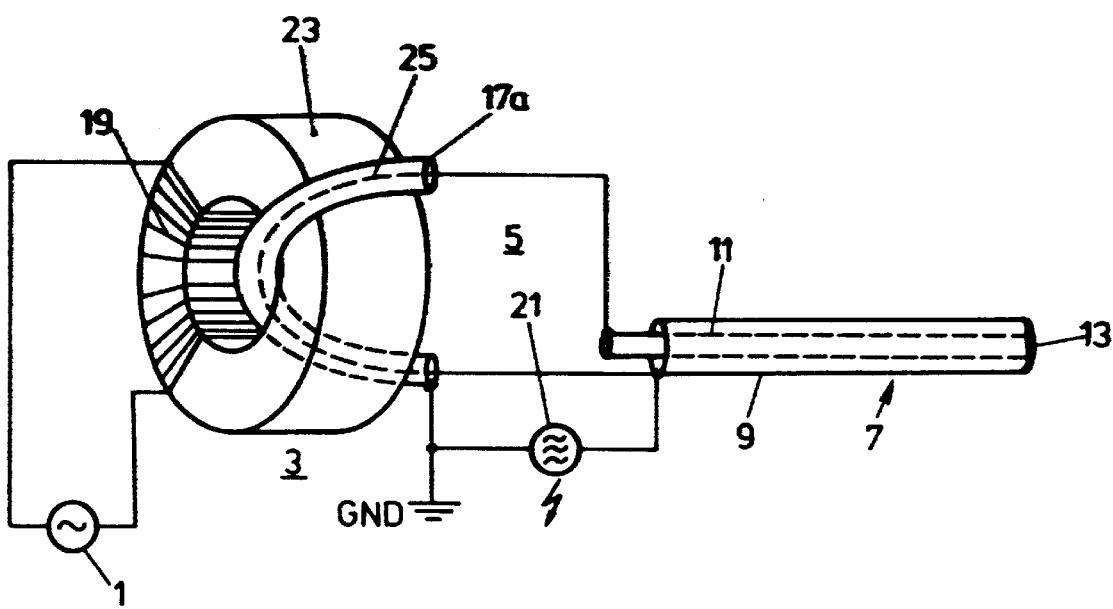
FIG. 5 is a schematic view of a currently preferred embodiment of the heating system according to the present invention for a high-frequency plasma discharge process.

FIG. 5 is a schematic view of a preferred implementation of the heating system according to the present invention in which the heating electrode 7 also forms the high-frequency plasma discharge electrode in or for a high-frequency plasma discharge process, as for a PECVD-process or plasma polymerization process according to EP-A-0 533 044. In view of the above explanation of FIGS. 1 to 4, a person skilled in this art requires no additional explanation concerning FIG. 5, in which, in addition to the above-described parts provided with the same reference numerals, reference number 19 indicates the primary winding of the transformer transmitter 3, and reference numeral 21 indicates the high-frequency high-voltage operating source for the high-frequency plasma discharge. Furthermore, reference numeral 23 indicates the core of the transformer transmitter 3, and reference numeral 25 indicates the internal conductor of the coaxial cable provided with the shielding 17a. The internal conductor 25 forms the secondary winding of the transformer transmitter 3.

Figure 6:
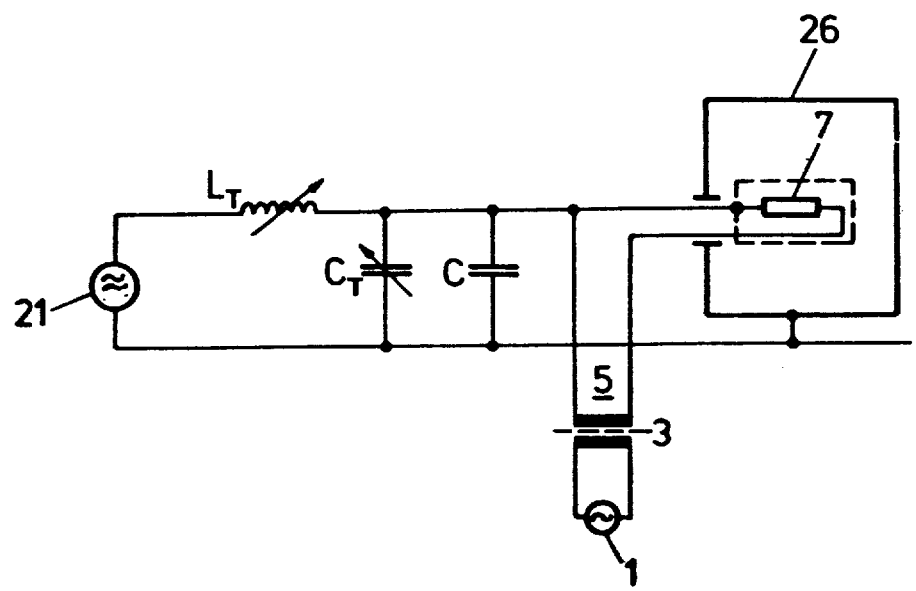
FIG. 6 is an electrical equivalent diagram of the system according to FIG. 5 on a process chamber with a preferred connection of the potential of the process chamber wall.

FIG. 6 is the electric equivalent diagram of the system according to FIG. 5. Identical parts in both figures again have the same reference numerals. Reference numeral 26 indicates the process chamber wall which is also connected to the reference potential, for example, ground. The elements $L_T$ and $C_T$ represent the elements of an adaptation network for the high-frequency generator 21, while C represents the stray capacitance between the high-frequency-potential-operated heating current circuit 5 and the reference potential, particularly the shielding 17, which stray capacitance C is shown in FIG. 3 by a broken line. As illustrated in FIG. 6, the stray capacitance C can also be taken into account by a corresponding dimensioning or adjustment of the adaptation capacitance $C_T$.

Figure 7:
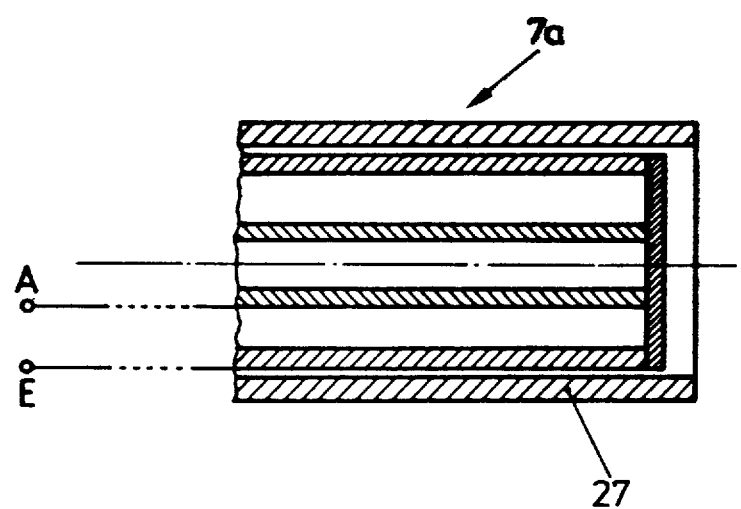
FIG. 7 is a partial view of a heating electrode of the heating system according to the present invention provided for plasma treatment processes with a protective jacket tube for which the operating process according to the present invention is particularly suitable.

FIG. 7 shows a heating electrode 7*a* which is particularly suitable for a vacuum process chamber. It is known that, in a vacuum chamber, the interior surfaces are also treated, for example, sputtered, but particularly are coated. In order to protect the heating electrode in this respect, an exchangeable protective jacket or tube 27, which can be cleaned or replaced according to the circumstances, is fastened on the heating electrode or on the chamber and into which the heating electrode is introduced. Although, according to the vacuum chamber process, the protective tube can consist of different optionally selected materials, a glass tube is preferably used, such as a tube made of a heat-resistance glass including, but not limited to, Pyrex.

If impairment of the process is due to a coating, the external protective tube surface is preferably treated for increasing the layer adhesion, preferably by being roughened, such as sand-blasting. Thus, a chipping-off of the disturbing layer from the protective tube is drastically reduced. This is achieved in that processes-caused fast temperature changes are dampened on the protective tube 27 by a corresponding heating of the heating electrode. As a result, the alternating thermal stress of the tube is also reduced.

During the operation of the plasma discharge with 1.6 kW pulsed power at a pulse repetition frequency of 300 kHz, the coating can be carried out continuously without any problems also in the case of several interruptions, with the plasma polymerization having taken place in a Hexamethyl-disiloxane atmosphere of approximately 0.2 mbar. Without any heating of the operating electrode, even after a single interruption of the coating process, cracks occurred in the glass tube 27 and there was a chipping-off of the disturbing layer from the tube 27.

With the heating system of the present invention, processes can be carried out in a process chamber and particularly in a vacuum process chamber equipped therewith in a more controlled, therefore in a qualitatively better, manner for longer periods of time without any interruption. Consequently, costs will also be lower.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A heating system for a vacuum process chamber having heating circuit with a heating electrode, and a transformer transmitter for generating, on a secondary side thereof, a heating current in the heating current circuit looped between adjacent current connections, wherein the heating electrode comprises a process electrode for an electrode-supported process in a process chamber, and the heating current circuit is connected by a process-electrode operating source to an electric operating potential, and wherein the operating source and a shielding between primary and secondary windings of the transformer transmitter, are connected to a reference potential.

2. The heating system according to claim 1, wherein heating current looping is implemented on the heating electrode by at least one coaxial conductor arrangement, on which, opposite the current connections, coaxial conductors are connected on the end side in a conductive manner.

3. The heating system according to claim 1, wherein the reference potential is a ground potential.

4. The heating system according to claim 1, wherein the secondary winding of the transformer transmitter is a coaxial cable, on which at least one exterior coaxial conductor forms shielding.

5. A vacuum process chamber having a heating system, comprising heating circuit with a heating electrode, and a transformer transmitter for generating, on a secondary side thereof, a heating current in the heating current circuit looped between adjacent current connections, wherein the heating electrode, comprises a process electrode for an electrode-supported process in a process chamber, and the heating current circuit is connected by a process-electrode operating source to an electric operating potential, and wherein the operating source and a shielding between primary and secondary windings of the transformer transmitter, are connected to a reference potential.

6. The chamber according to claim 5, wherein the vacuum process chamber is a plasma process chamber and the heating electrode forms the electrode for forming the plasma discharge in the chamber.

7. The chamber according to claim 6, wherein the plasma discharge is one of an AC–discharge, AC+DC–discharge, a high-frequency discharge and a pulsed plasma discharge.

8. A process for operating a plasma process chamber with a heating current circuit including a heating electrode, and a heating system for a vacuum process chamber having a transformer transmitter for generating, on a secondary side thereof, a heating current in the heating current circuit looped between adjacent current connections, the vacuum process chamber is a plasma process chamber and the heating electrode constitutes the electrode for forming plasma discharge in the chamber, comprising the steps of coating the electrode in a process-compatible manner, and connecting the heating current circuit by a process-electrode operating source to an electrode operating potential, connecting the operating source and a shielding between primary and secondary windings of the transformer transmitter to a reference potential, and guiding the heating current in the heating current circuit to dampen process-caused, time-related temperature jumps on the electrode.

9. A heating system for a vacuum process comprising: a heating electrode with a coaxial conductor arrangement on which coaxial conductors are conductively connected at one end thereof; a transformer transmitter with a primary wind and a secondary winding, the secondary winding being connected to said coaxial conductors at another end thereof and forming with said coaxial conductors a heating current loop arrangement; and a connection tap provided at said current loop arrangement distant from said one end whereat said coaxial conductors are conductively connected for applying a desired electric potential to said current loop arrangement.

10. The heating system according to claim 9, further comprising a shield between said primary and secondary winding of said transformer-transmitter, said shield comprising a further tap for applying a desired electric potential to said shield.

11. The heating system according to claim 10, wherein said heating electrode comprises a process electrode for an electrode-supported process in a process chamber and whereat said tap provided at said current loop is connected to a process-operating electrical source and said tap of said shield is connected to a reference potential.

12. The heating system according to claim 10 wherein said shield is formed by an outer conductor of a further coaxial conductor arrangement, the inner conductor of said further coaxial conductor arrangement forming said secondary winding.

13. The heating system according to claim 11, wherein said reference potential is a ground potential.

14. The heating system according to claim 11, wherein said process-operating electrical source is one of an AC source and of an AC+DC source.

15. The heating system according to claim 14, wherein said AC source is a high frequency source.

16. The heating system according to claim 9, wherein said winding loops of secondary winding are substantially less in number than winding loops of said primary winding.

17. The heating system according to claim 16, further comprising an annular transformer core, said secondary winding being formed by a single U-shaped loop through said annular core.

18. The heating system according to claim 9, further comprising an exchangeable jacket applied over said coaxial conductor arrangement.

19. The heating system according to claim 18, wherein said exchangeable jacket is made of temperature-resistant glass.

20. The heating system according to claim 17, wherein an outer surface of said exchangeable jacket is sand-blast-treated.

21. A vacuum process chamber having a heating system, comprising a heating electrode with a coaxial conductor arrangement extending into said vacuum chamber on which coaxial conductors are conductively connected at one end of said arrangement; a transformer transmitter with a primary winding and a secondary winding, the secondary winding being connected to said coaxial conductors at another end of said arrangement and forming with said coaxial conductors a heating current loop arrangement; and a tap provided at said current loop arrangement distant from said one end for applying a desired electric potential to said loop arrangement.

22. The chamber according to claim 21, further comprising a shield between said primary winding and said secondary winding with a tap for applying a desired electric potential to said shield.

23. The chamber according to claim 22, wherein said heating electrode comprises a process electrode for an electrode-supported process in said chamber, said tap provided at said current loop is connected to a process-operating electrical source, and said tap provided at said shield is connected to a reference potential.

24. The chamber according to claim 23, wherein the vacuum process chamber is a plasma process chamber, and said heating electrode forms an electrode for generating a plasma discharge in said chamber.

25. A plasma process within a plasma treatment chamber having surfaces exposed to a plasma discharge being solid material coated and a heater electrode exposed to said plasma discharge, comprising the steps of controlling heating of said electrode so as to dampen rapid temperature variations at said electrode and caused by said plasma process so as to prevent solid material deposited on said heater electrode from flaking off.

* * * * *